US008362676B2

(12) United States Patent
Morita

(10) Patent No.: US 8,362,676 B2
(45) Date of Patent: Jan. 29, 2013

(54) PIEZOELECTRIC VIBRATING DEVICES HAVING CONTROLLED INTERNAL ENVIRONMENT, AND METHODS FOR MANUFACTURING SAME

(75) Inventor: Kunio Morita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/189,455

(22) Filed: Jul. 22, 2011

(65) Prior Publication Data

US 2012/0025672 A1 Feb. 2, 2012

(30) Foreign Application Priority Data

Jul. 29, 2010 (JP) ................... 2010-170446

(51) Int. Cl.
*H01L 41/053* (2006.01)

(52) U.S. Cl. ........................ 310/348; 310/344

(58) Field of Classification Search .................. 310/344, 310/348
See application file for complete search history.

(56) References Cited

U.S. PATENT DOCUMENTS

| 8,089,200 B2 * | 1/2012 | Kawahara ...................... 310/344 |
| 8,212,453 B2 * | 7/2012 | Kohda ........................... 310/344 |
| 8,227,958 B2 * | 7/2012 | Inoue et al. ................... 310/344 |
| 2011/0234052 A1 * | 9/2011 | Amano et al. ................ 310/344 |
| 2012/0068578 A1 * | 3/2012 | Takahashi ..................... 310/344 |

FOREIGN PATENT DOCUMENTS

JP 2005-026974 1/2005

* cited by examiner

*Primary Examiner* — Thomas Dougherty
(74) *Attorney, Agent, or Firm* — Klarquist Sparkman, LLP

(57) ABSTRACT

Methods are disclosed for manufacturing piezoelectric vibrating devices that do not acquire unwanted gas or water vapor inside their respective packages during manufacture and that attain such end by methods suitable for mass-production. An exemplary manufacturing method includes preparing a piezoelectric wafer having multiple piezoelectric frames; on the piezoelectric wafer defining at least one first through-hole per frame; preparing a base wafer having multiple package bases alignable with the frames; on the base wafer defining at least one second through-hole; preparing a lid wafer having multiple package lids alignable with the frames; applying a sealing material between a first main surface of each frame and an inner main surface of the base wafer, and between a second main surface of each frame and an inner main surface of the lid wafer; and thereby bonding the three wafers together to form multiple packaged piezoelectric devices. To facilitate ventilation of gas from inside each package during bonding, each package includes at least one communicating groove extending from inside the package to the first or second through-hole. After venting, the communicating groove is sealed automatically with sealing material.

8 Claims, 13 Drawing Sheets

PIEZOELECTRIC VIBRATING DEVICES HAVING CONTROLLED INTERNAL ENVIRONMENT, AND METHODS FOR MANUFACTURING SAME

CROSS-REFERENCE TO RELATED APPLICATION

This application claims priority to and the benefit of Japan Patent Application No. 2010-170446, filed on Jul. 29, 2010, in the Japan Patent Office, the disclosure of which is incorporated herein by reference in its entirety.

FIELD

This disclosure pertains to, inter alia, piezoelectric vibrating devices that, during their manufacture, automatically ventilate unwanted gas and water vapor from inside their respective packages, and to methods for manufacturing such devices.

DESCRIPTION OF THE RELATED ART

A surface-mount type piezoelectric device is one in which a piezoelectric vibrating piece is mounted on a package base that is not electrically conductive, and sealed in the package by a lid (which is also part of the package and typically not electrically conductive). During manufacture of a piezoelectric device, the package base and package lid are stacked in registration with each other, and a layer of sealing material, such as a polymeric resin or low-melting-point glass, is used to bond the package base and package lid either to each other or to an intervening structure to form a "package." Using resin as a sealing material can cause problems because polymeric resins tend to release gas during exposure to elevated temperatures required for curing the resin. The released gas, especially if entrapped within the package, can adversely affect vibration of the piezoelectric vibrating piece inside the package. Even low-melting-point (LMP) glass can release unwanted gas from bubbles in the glass during an elevated-temperature sealing step.

Japan Patent Publication No. JP 2005-026974A discusses a method for preventing released unwanted gas from entering a device package. On the entire edge surface of the no-conductive base, a first layer of LMP glass is applied for temporary hardening. Then, a layer of a second LMP glass is applied over the first layer and temporarily hardened. The second LMP glass is not applied to designated regions of the surface of the second LMP glass, particularly regions connected to inside the package.

Disadvantageously, the method discussed JP '974 requires two or more applications of LMP glass and respective temporary hardening steps, which is process-intensive. Also, if the second LMP glass has low viscosity, then the second LMP glass spreads tends to spread to regions where LMP glass is not wanted. Replacing the low-viscosity LMP glass with a higher-viscosity LMP glass poses difficulties in procedure used for applying the glass. Furthermore, the manufacturing methods discussed in JP '974 require applying LMP glass on each piezoelectric device, which is unsuitable for mass-production.

Therefore, there is a need for methods for manufacturing piezoelectric devices, as disclosed herein, that do not result in entrapment of unwanted gas or water vapor inside the package containing the piezoelectric vibrating device. There is also a need for piezoelectric vibrating devices that do not contain unwanted gas or water vapor.

SUMMARY

Various aspects of the invention are summarized below. A first aspect is directed to methods for manufacturing piezoelectric devices. An exemplary embodiment of such a method comprises preparing a piezoelectric wafer having first and second main surfaces and including an array of multiple piezoelectric frames. Each piezoelectric frame includes a piezoelectric vibrating piece and a respective exterior frame that surrounds and supports the piezoelectric vibrating piece. The piezoelectric wafer also includes, for each piezoelectric frame in the array, at least a pair of first through-holes disposed between adjacent exterior frames in the array. Each first through-hole extends from the first main surface to the second main surface. Also prepared is a base wafer that has inner and outer main surfaces and includes an array of package bases that are co-alignable with the array of piezoelectric frames. Each package base includes at least one external electrode on the outer main surface and at least a pair of second through-holes disposed between adjacent package bases in the array. Each second through-hole extends from the inner main surface to the outer main surface. Also prepared is a lid wafer that includes an array of multiple package lids that are co-alignable with the array of piezoelectric frames. The lid wafer has an inner main surface and an outer main surface. For each piezoelectric frame in the array, at least one respective communicating groove is defined that extends from one main surface of the piezoelectric frame to the inner main surface of the package base, or that extends from the other main surface of the piezoelectric frame to the inner main surface of the package lid, such that the communicating groove opens into at least one of the first and second through-holes. A sealing material is placed between the second main surface of each exterior frame and the inner main surface of each respective package base, and between the first main surface of each exterior frame and the inner main surface of each respective package lid. The wafers are co-aligned and bonded together by bonding together each co-aligned package lid, piezoelectric frame, and package base using the placed sealing material to form respective packages each containing a respective piezoelectric vibrating piece. During bonding, each package automatically vents through the respective communicating groove, and the communicating groove(s) are automatically sealed with the sealing material so as to preserve the desired environment inside the packages. The sealing material desirably comprises an adhesive made of glass, epoxy resin, or polyimide resin.

Each piezoelectric frame desirably is formed so as to have at least one excitation electrode. During manufacture of such devices, a metal film is formed on the inside surfaces of the through-holes, and the metal film is formed so as to connect the excitation electrode(s) to respective external electrode(s).

Some embodiments have a rectangular profile as viewed from above the package lid or below the package base. In these embodiments it is desirable that each first and second through-hole be located at a respective corner of the rectangular profile. Alternatively, each first and second through-hole can be located on a respective side of the rectangular profile.

Another aspect of the invention is directed to piezoelectric devices. An exemplary embodiment of such a device comprises a piezoelectric frame including a piezoelectric vibrating piece having first and second main surfaces and a respective excitation electrode on each of the first and second main surfaces. The piezoelectric frame also includes an outer frame surrounding the piezoelectric vibrating piece. The device also includes a package base having an inner and an outer main surface. The outer main surface includes at least one external electrode, and the inner main surface is bonded to the second main surface of the piezoelectric frame. The device also includes a package lid having an inner and an outer main surface, wherein the inner main surface is bonded to the first main surface of the piezoelectric frame. A sealing material is disposed peripherally relative to the outer frame so as to be peripherally arranged relative to each of the first and second main surfaces of the piezoelectric frame. The sealing material thus bonds the piezoelectric frame to the package lid and to the package base to form a package defining a package cavity containing the piezoelectric vibrating piece. The device also has at least one communicating groove that extends from the cavity and that is defined in at least one of the first and second main surfaces of the outer frame, the inner main surface of the package base, and the inner main surface of the package lid. The at least one communicating groove is sealed with the sealing material.

Some embodiments have a rectangular profile when viewed from above the package lid or below the package base. The rectangular profile includes four corners, and each corner includes a respective castellation defining a corresponding edge-surface. A first edge-surface can include a respective edge-surface electrode extending at least between the first and second main surfaces of the piezoelectric frame and being connected to one of the excitation electrodes. A second edge-surface can include a respective edge-surface electrode extending at least between the first and second main surfaces of the piezoelectric frame and being connected to the external electrode.

Further with respect to packages having a rectangular profile, the rectangular profile includes four sides, and each side can include a respective castellation defining a corresponding edge-surface. A first edge-surface includes a respective edge-surface electrode extending at least between the first and second main surfaces of the piezoelectric frame and being connected to one of the excitation electrodes. A second edge-surface includes a respective edge-surface electrode extending at least between the first and second main surfaces of the piezoelectric frame and being connected to the external electrode.

Another embodiment of a piezoelectric device comprises a package base comprising an inner main surface and an outer main surface. The inner main surface defines a cavity, and the outer main surface includes at least one external electrode. A piezoelectric vibrating piece is disposed in the cavity. The piezoelectric vibrating piece has a first main surface including a first excitation electrode and a second main surface including a second excitation electrode. The device includes a package lid having an inner main surface and an outer main surface. The inner main surface of the package lid is bonded to the package base by a sealing material, thereby forming a package containing the piezoelectric vibrating piece. At least one communicating groove is defined in the inner main surface of the package base or the inner main surface of the package lid. The communicating groove extends from the cavity to outside the package and is sealed with the sealing material.

The embodiments summarized above, as well as other embodiments within the scope of the invention, have package cavities that do not contain any unwanted gas or water vapor. The subject devices are also suitable for mass-production. As a result of their having controlled environments inside their respective packages, the subject piezoelectric devices produce steady vibration accurately at a specified frequency.

DETAILED DESCRIPTION

Various embodiments are described in detail below, with reference to the accompanying drawings.

In the described embodiments, an AT-cut quartz-crystal vibrating piece having thickness-shear vibrating mode is used as the piezoelectric vibrating piece. An AT-cut quartz-crystal vibrating piece has a principal surface (in the XZ plane) that is tilted by 35° 15' about the Y-axis of the crystal coordinate system (XYZ) in the direction of the Y-axis from the Z-axis around the X-axis. Thus, in the following description, new axes tilted with respect to the axial directions of the quartz-crystal vibrating piece are denoted as the X'-axis, Y'-axis, and Z'-axis, respectively. Regarding a height in the Y'-axis direction, a positive (+) direction is denoted as high and a negative (−) direction is denoted as low.

First Embodiment

Figure 1:
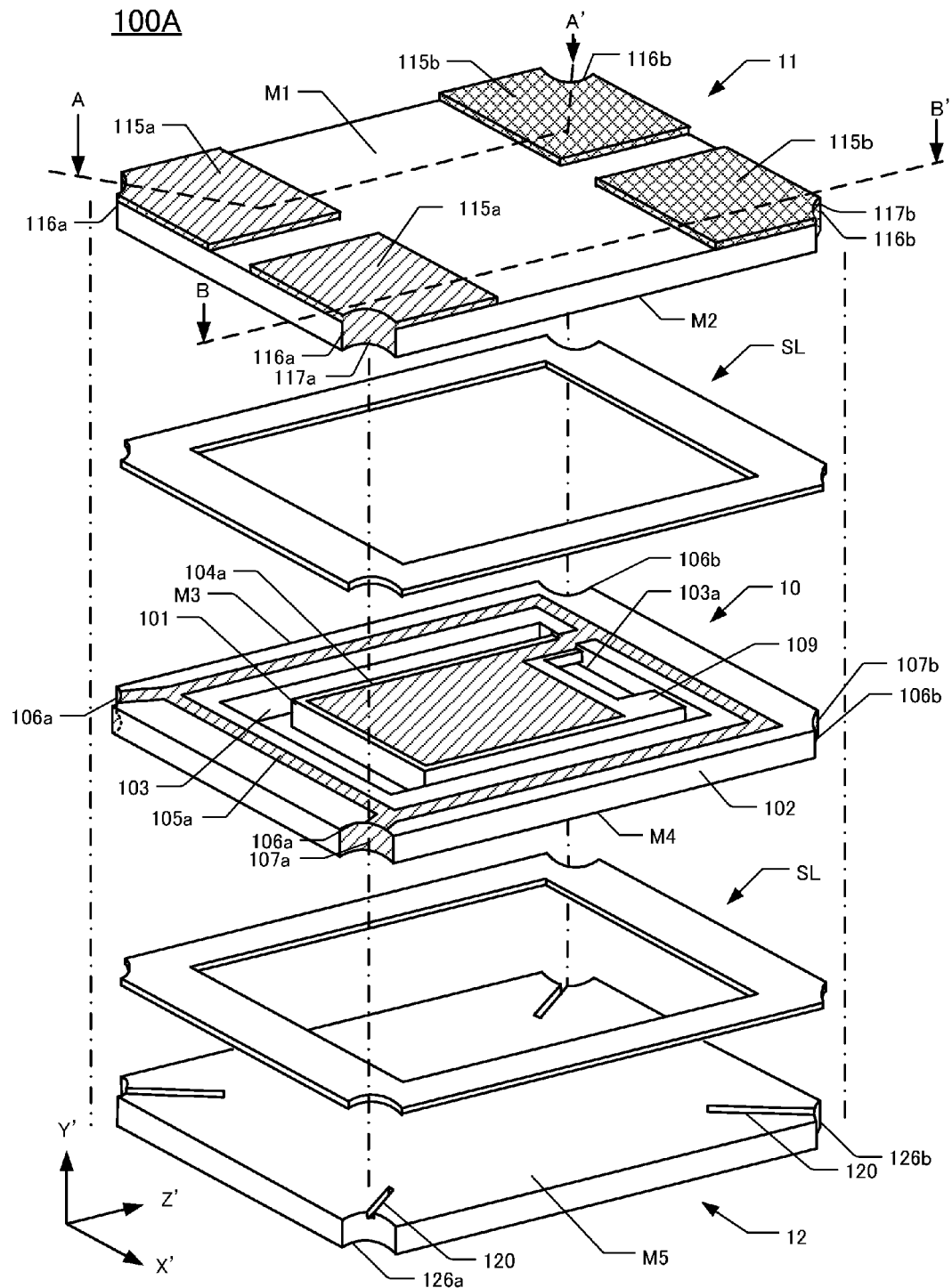
FIG. 1 is an exploded perspective view of a first embodiment of a piezoelectric device.
Figure 2A:
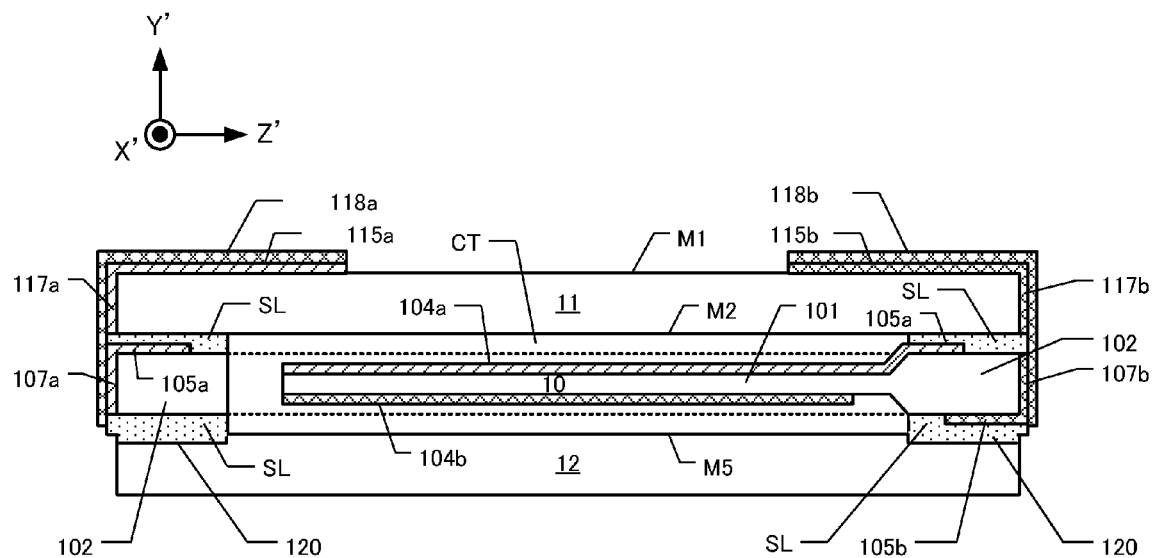
FIG. 2A is a cross-sectional view along the line A-A' in FIG. 1, after bonding together a quartz-crystal frame, a package base, and a package lid.
Figure 2B:
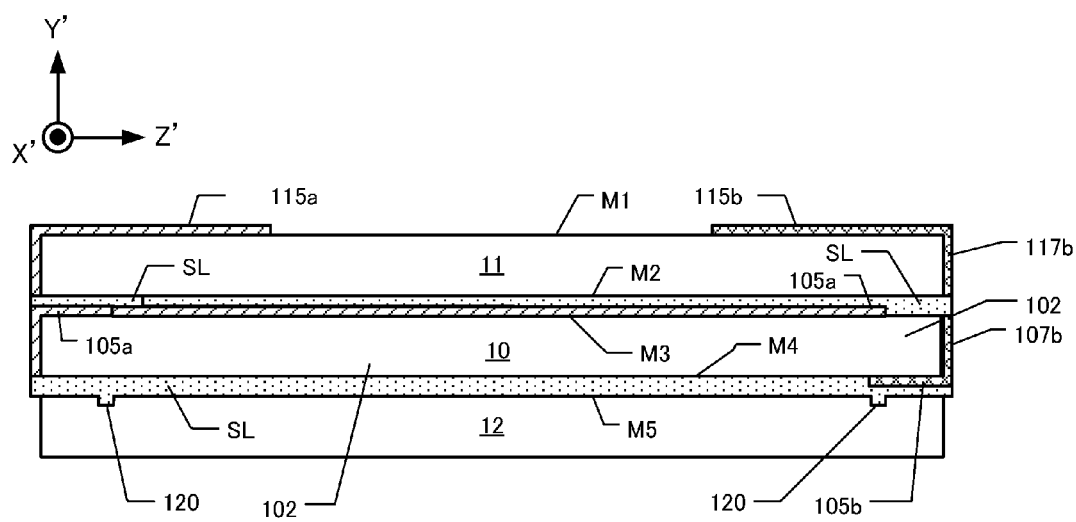
FIG. 2B is a cross-sectional view along the line B-B' in FIG. 1, after bonding together the quartz-crystal frame, a package base, and a package lid.

The overall configuration of a piezoelectric device 100A according to this embodiment is shown in FIGS. 1 and 2A-2B. FIG. 1 is an exploded perspective view of the piezoelectric device 100A. Note that the view shown in FIG. 1 is upside-down, with the package base 11 being shown uppermost. FIG. 1 also does not show connection electrodes 118a, 118b (but see FIG. 2A). FIG. 2A is an elevational section along the line A-A' in FIG. 1. FIG. 2B is an elevational section along the line B-B' in FIG. 1.

This embodiment of a piezoelectric vibrating device 100A includes a quartz-crystal frame 10, a package base 11, and a package lid 12. The package base 11 and package lid 12 can be made of a glass or quartz-crystal material. The quartz-crystal frame 10 and package base 11 are bonded together using a sealing material SL. Similarly, the quartz-crystal frame 10 and the package lid 12 are bonded together using the sealing material SL. A package cavity CT (FIG. 2A) is formed by bonding the package base 11 and package lid 12 to the quartz-crystal frame 10. The package cavity CT is either at a particular vacuum level or filled with an inert gas. In either event the package cavity CT is sealed from the external environment.

The quartz-crystal frame 10 is formed of AT-cut quartz-crystal material. The frame 10 includes a first bonding surface M3 facing the +Y'-direction and a second bonding surface M4 facing the −Y'-direction. The quartz-crystal frame 10 comprises a vibrating portion 101 and a frame portion 102 surrounding the vibrating portion 101. Between the vibrating portion 101 and the frame portion 102 are a U-shaped first void 103 and a second void 103a. A connecting portion 109 joins the vibrating portion 101 to the frame portion 102. On the first and second (upper and lower) main surfaces of the vibrating portion 101 are respective excitation electrodes 104a, 104b (see FIG. 2A). On both main surfaces of the frame portion 102 are respective extraction electrodes 105a, 105b (FIG. 2A) that are electrically connected to the respective excitation electrodes 104a, 104b.

Each corner of the crystal frame 10 has a respective castellation 106a, 106b, thereby providing two castellations 106a and two castellations 106b. On the surface of each castellation 106a is a respective edge-surface electrode 107a, and on the surface of each castellation 106b is a respective edge-surface electrode 107b. Similarly, each corner of the package base 11 has a respective castellation 116a, 116b, thereby providing two castellations 116a and two castellations 116b. On the surface of each castellation 116a is a respective edge-surface electrode 117a, and on the surface of each castellation 116b is a respective edge-surface electrode 117b. The edge-surface electrodes 107a are connected to the extraction electrodes 105a and to the edge-surface electrodes 107a. The edge-surface electrodes 107b are connected to the extraction electrodes 105b and to the edge-surface electrodes 117b.

Figure 4:
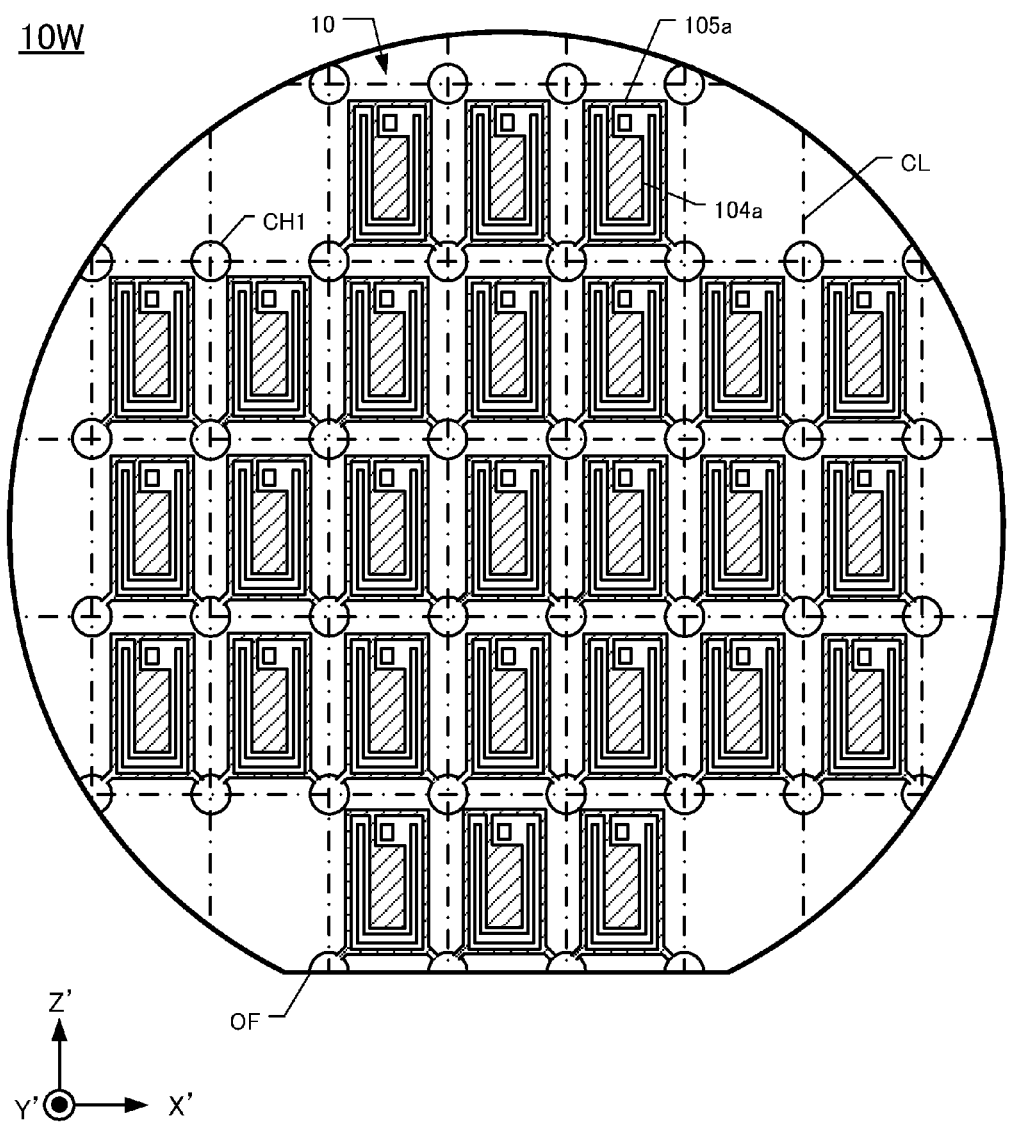
FIG. 4 is a plan view of a quartz-crystal wafer.

The quarter-round castellations 106a, 106b are formed from corresponding full-round through-holes by perpendicular dicing cuts intersecting each other at the center of the respective through-hole (FIG. 4).

The package base 11 comprises an external main surface ("mounting surface") M1 and a bonding main surface (interior main surface) M2. On the external main surface M1 are two pairs of external electrodes 115a, 115b, respectively. As a result, four electrical connections can be made to the device 100A. A respective castellation 116a, 116b is formed on each corner of the package base 11, providing a total of four castellations. One of the castellations 116a has a respective edge-surface electrode 117a, by which the respective external electrode 115a can be electrically connected to the respective edge-surface electrode 107a. The other castellation 116a lacks the edge-surface electrode 117a and thus can be used as an electrical-ground terminal. Similarly, one of the castellations 116b has a respective edge-surface electrode 117b, by which the respective external electrode 115b can be electrically connected to the respective side-surface electrode 107b. The other castellation 116b lacks the edge-surface electrode 117b and thus can be used as an electrical-ground terminal.

The quarter-round castellations 116a, 116b are formed from corresponding full-round through-holes by perpendicular dicing cuts intersecting each other at the center of the respective through-hole (FIG. 4).

The package lid 12 includes an external (outer) main surface and an internal (bonding main) M5. A respective castellation 126a, 126b is formed on each corner of the package lid 12, providing a total of four castellations. On the bonding main surface M5 are grooves 120 extending inboard of the respective castellations 126a, 126b. One groove 120 provides communication between one of the castellations 126a and one of the castellations 126b. The other groove 120 provides communication between the other of the castellations 126a and the other of the castellations 126b.

Figure 6:
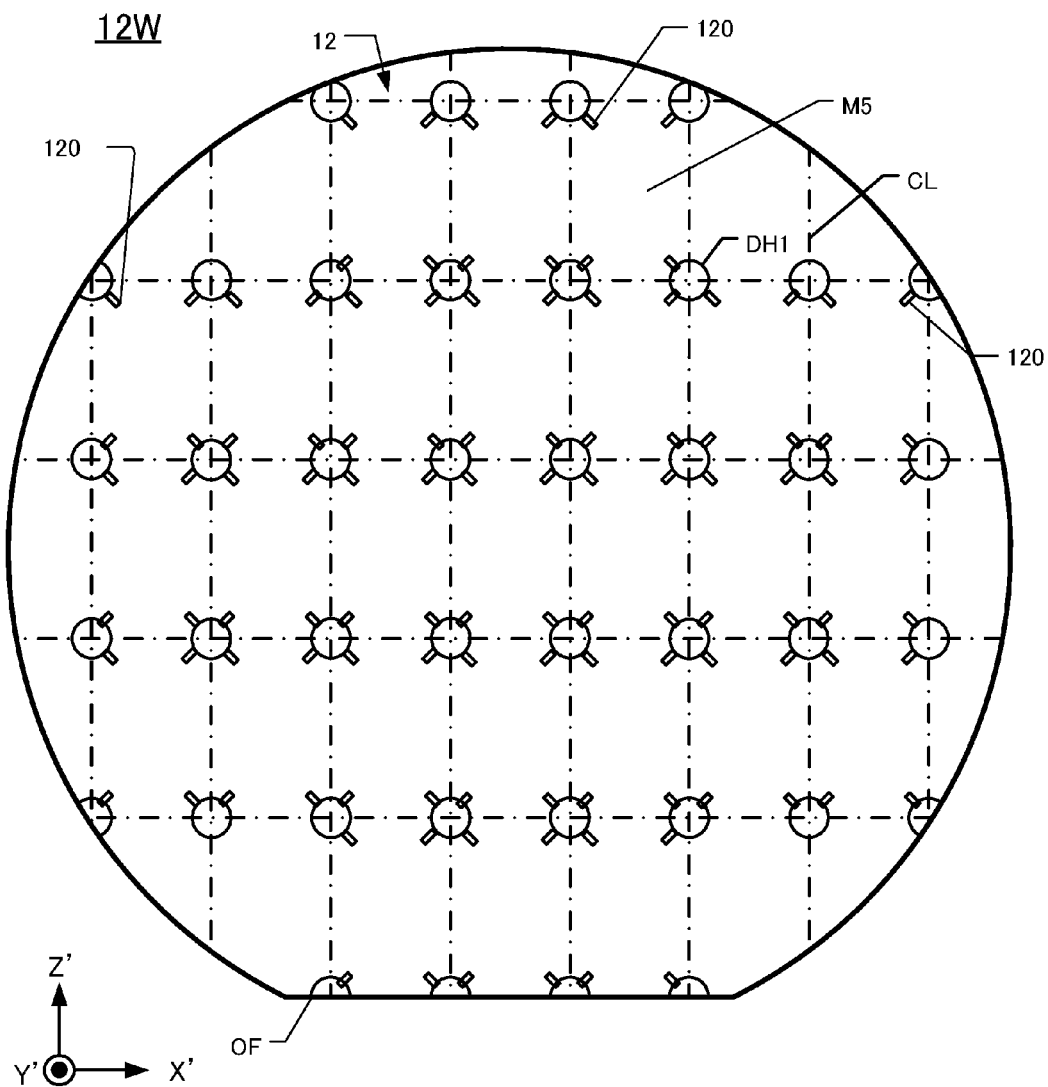
FIG. 6 is a plan view of a lid wafer.

The quarter-round castellations 126a, 126b are formed from corresponding full-round through-holes by perpendicular dicing cuts intersecting each other at the center of the respective through-hole (FIG. 6).

In FIG. 1 the sealing materials SL between the package base 11 and frame 10, and between the frame 10 and the package lid 12, are made of LMP glass, polyimide resin, or epoxy resin containing vanadium. The sealing materials SL are shown being formed as respective gaskets (FIG. 1). More commonly, the sealing materials SL are applied by screen-printing or the like directly on the bonding surfaces M3, M4. The sealing material SL is normally not available in sheet format.

LMP glass, polyimide resin, and epoxy resins are resistant to water and humidity. Consequently, when used as sealing materials SL, they prevent water vapor from entering the package and from damaging the hermetic seal of the package cavity. LMP glass is a lead-free vanadium-based glass that melts at 350° C. to 400° C. Vanadium-based glass can be formulated as a paste mixed with binder and solvent. This adhesive bonds to other materials by processes involving firing and cooling. Vanadium-based LMP glass seals are hermetic and have a reduced coefficient of thermal expansion as a result of control of the glass structure.

In FIG. 2B, the sealing material SL applied between the bonding surface M2 of the package base 11 and the bonding surface M3 of the frame portion 102 bonds the crystal frame 10 and the package base 11 together. Similarly, the sealing material SL applied between the bonding surface M5 of the package lid 12 and the bonding surface M4 of the frame portion 102 bonds the crystal frame 10 and the package lid 12 together.

As noted above and shown in FIGS. 2A and 2B, grooves 120 are defined on the bonding surface M5. During bonding, overflowing sealing material SL flows into the grooves 120 so that the cavity CT formed by bonding the crystal frame 10, package base 11, and package lid 12, is hermetically sealed.

In FIG. 2A, the piezoelectric device 100A has an outer surface that includes connection electrodes 118a, 118b. The connection electrode 118a covers at least a portion of the exterior electrode 115a, the edge-surface electrode 117a, and the edge-surface electrode 107a. Similarly, the connection electrode 118b covers at least a portion of the exterior electrode 115b, the edge-surface electrode 117b, and the edge-surface electrode 107b. This structure allows the external electrodes 115a, 115b, edge-surface electrodes 117a, 117b, and the edge-surface electrodes 107a, 107b to be electrically connected.

To stimulate vibration, an alternating voltage (voltage that alternates from positive to negative to positive . . . ) is applied across the external electrodes 115a, 115b, and across the connection electrodes 118a, 118b, all situated on the mounting surface M1 of the package base 11 of the device 110A. On the vibrating portion 101, the external electrode 115a, edge-surface electrode 117a, connection electrode 118a, inner electrode 107a, and extraction electrode 105a all have the same instantaneous polarity, while the external electrode 115*b*, edge-surface electrode 117*b*, connection electrode 118*b*, inner electrode 107*b*, and extraction electrode 105*b*, all have the same (but opposite) polarity.

Figure 3:
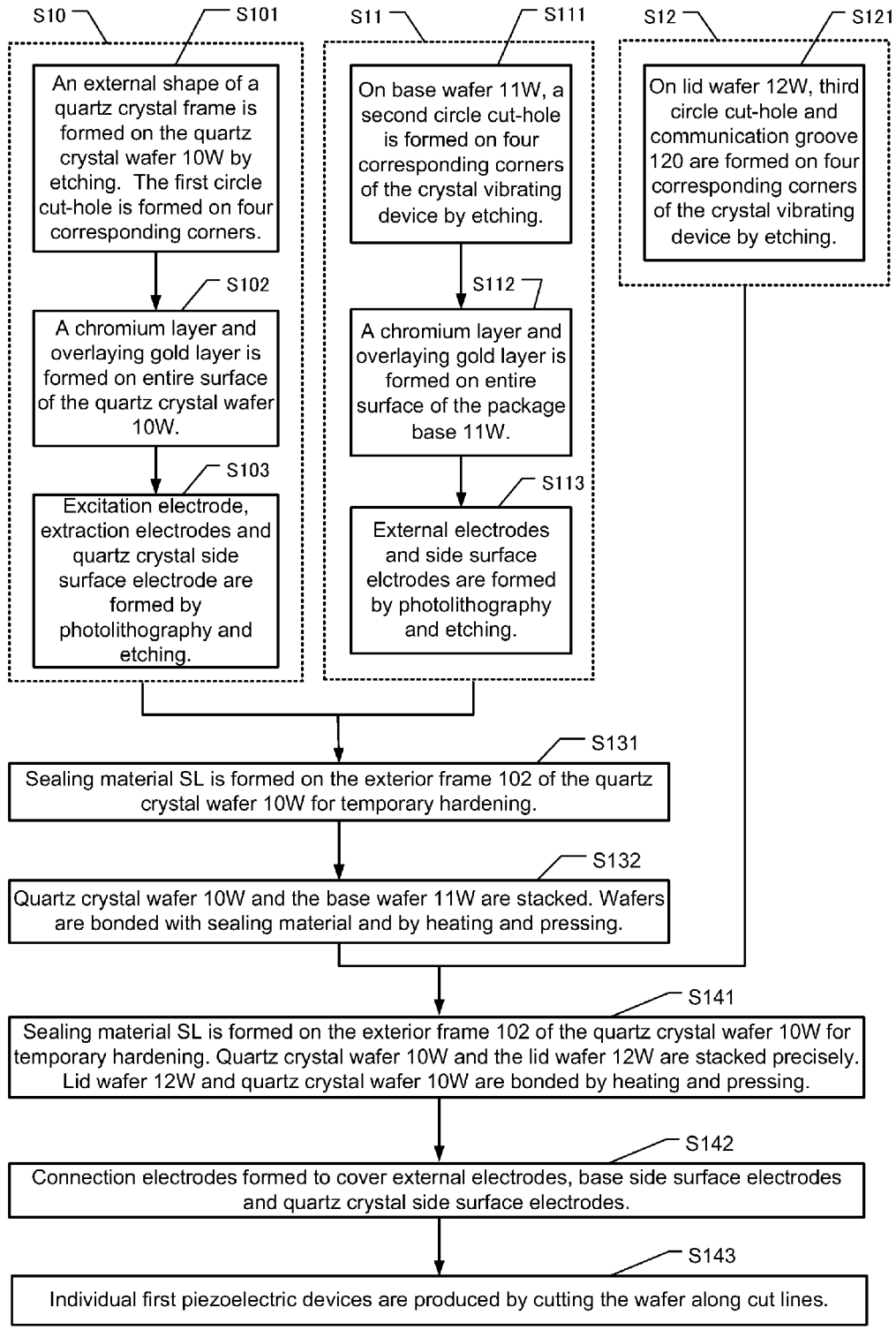
FIG. 3 is a flow-chart of an embodiment of a method for manufacturing a piezoelectric device according to the first embodiment.
Figure 5:
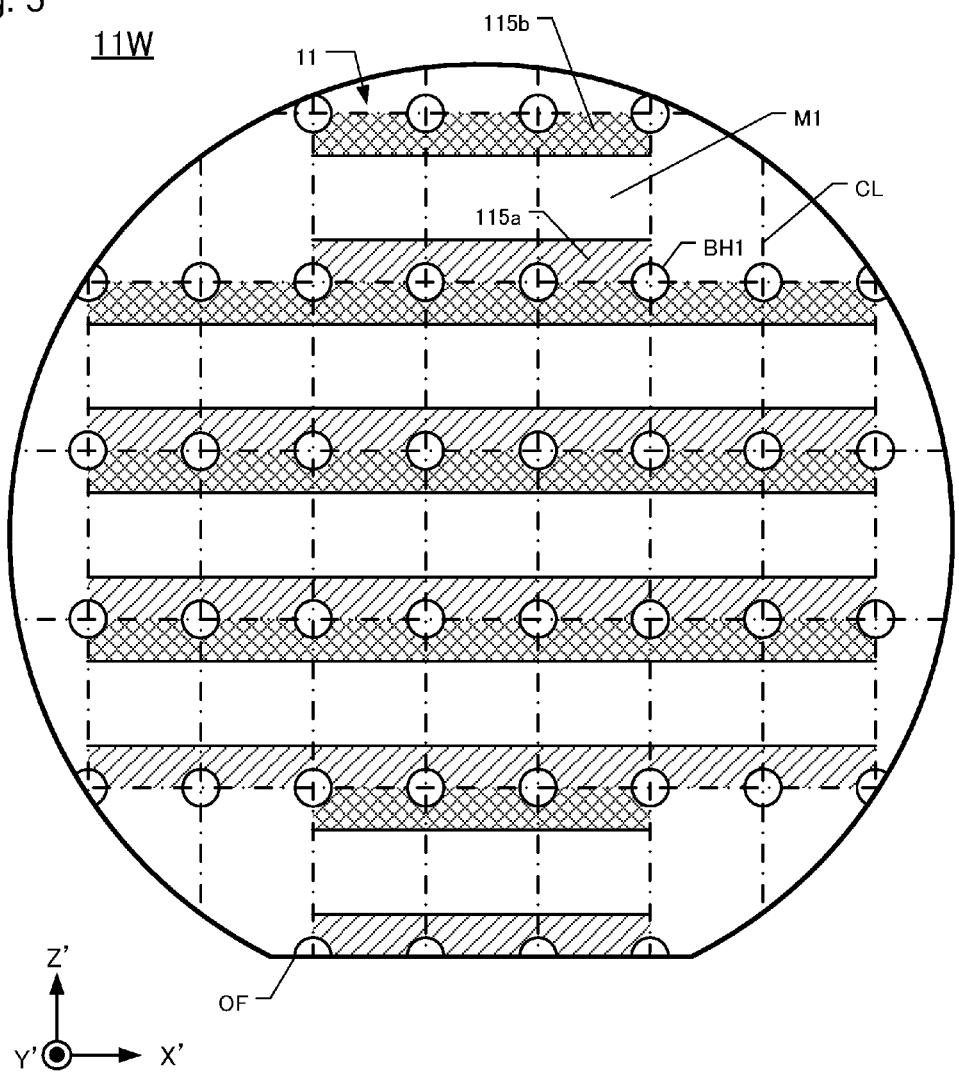
FIG. 5 is a plan view of a base wafer.

The piezoelectric device 100A can be manufactured by a method depicted in FIG. 3. FIG. 4 is a plan view of the crystal wafer 10W, FIG. 5 is a plan view of the base wafer 11W, and FIG. 6 is a plan view of the lid wafer 12W.

In protocol S10 of the method, the quartz-crystal frame 10 is manufactured. Protocol S10 includes steps S101 to S103. In step S101 the profile outlines of multiple quartz-crystal frames 10 are formed on a crystal wafer 10W (FIG. 4) by etching. I.e., the vibrating portion 101, the exterior frame 102, and the voids 103, 103*a* are formed. Also, as shown in FIG. 4, the first through-holes CH1 are formed on the crystal wafer 10W on each of the four corners of each crystal frame 10. Dividing the first through-holes CH1 into four respective quarter-round sections later in the method produces the castellations 106*a*, 106*b* (FIG. 1). In step S102, a layer of chromium (Cr) is formed, followed by formation of an overlying layer of gold (Au), on the entire main surface of the quartz-crystal wafer 10W, including in the through-holes CH1. These metal layers are formed by sputtering or vacuum-deposition. An exemplary thickness of the chromium foundation layer is in the range of 0.05 µm to 0.1 µm, and an exemplary thickness of gold layer is in the range of 0.2 µm to 2 µm. In step S103 a photoresist is applied uniformly on the surface of the metal layer. Using an exposure tool (not shown), the profile outlines of the excitation electrodes 104*a*, 104*b*, the extraction electrodes 105*a*, 105*b*, and the edge-surface electrodes 107*a*, 107*b* are lithographically exposed onto the crystal wafer 10W, followed by etching of the denuded regions of the metal layer. In FIGS. 1 and 2, the excitation electrodes 104*a*, 104*b*, extraction electrodes 105*a*, 105*b*, and edge-surface electrodes 107*a*, 107*b* are formed around the first through-holes CH1.

In protocol S11, a package base 11 is manufactured. Protocol S11 includes steps S111-S113. In step S111, a quartz-crystal wafer 11W is prepared. Then, the through-holes BH1 (FIG. 5) are formed on the four corners of the package base 11 by etching so as to extend depthwise through the base wafer 11W. The through-holes BH1 form respective quarter-round castellations 116*a* or 116*b* (FIG. 1) later in the method during dicing.

In step S112, a layer of chromium (Cr) is formed, followed by formation of an overlying layer of gold (Au), on the mounting surface M1 and the second through-holes BH1 of the base wafer 11W by sputtering or vacuum-deposition. An exemplary thickness of the chromium foundation layer is in the range of 0.05 µm to 0.1 µm, and an exemplary thickness of the gold layer is in the range of 0.2 µm to 2 µm.

In step S113, a photoresist is applied uniformly on the surface of the metal layer. Using an exposure tool (not shown), the profile outlines of the external electrodes 115*a*, 115*b* and of the edge-surface electrodes 117*a*, 117*b* are exposed onto the base wafer 11W. Then, the metal layer, exposed by patterning the photoresist, is etched. As shown in FIGS. 1 and 2, the external electrodes 115*a*, 115*b* are formed on the mounting surface M1 of the base wafer 11W, and the edge-surface electrodes 117*a*, 117*b* are formed on the second through-holes BH1.

In protocol S12, package lids 12 are manufactured. Protocol S12 includes a steps S121-S122. In step S121, a quartz-crystal lid wafer 12W is prepared. Then, the through-holes DH1 (FIG. 6) are formed on the lid wafer 12W by etching on each of the four corners of each package lid 11 on the wafer. On the bonding surface M5 of the lid wafer 12W, communicating grooves 120 are formed that extend laterally from and communicate with the through-holes DH1 on the lid wafer. The communicating grooves 120 extend from the through holes DH1 at angles of 45°, 135°, 225°, and 315°, respectively (FIG. 6). The width of each communicating groove 120 is in an exemplary range of 0.1 µm to 10 µm, and the depth of each communicating groove 120 is in an exemplary range of 0.1 µm to 10 µm. Each through-hole DH1 forms four respective quarter-round castellations 126*a* or 126*b* (FIG. 1) whenever the through holes are cut into four sections. Each communicating groove 120 is connected to a respective castellation 126.

The protocol S10 for manufacturing quartz-crystal frames 10, the protocol S11 for manufacturing package bases 11, and the protocol S12 for manufacturing package lids 12 can be carried out in parallel.

In step S131, a sealing material SL is applied uniformly on the surface M3 of the exterior frame 102 on the quartz-crystal wafer 10W (FIG. 1). If the sealing material SL is LMP glass, it can be applied on the surface M3 by screen-printing, followed by a preliminary curing step. If the sealing material SL is a polyimide resin, it can be applied as such on the surface M3 of the exterior frame 102 followed by a temporary hardening step. The sealing material SL can be formed on the surface M2 of the base wafer 11W (FIG. 1).

In step S132, the quartz-crystal wafer 10W and the base wafer 11W are stacked in precise alignment with each other. Alignment is achieved by precisely checking the positions of the exterior profiles of the crystal frames on the quartz-crystal wafer 10W, checking positions of the four corners formed by cutting through the through-holes CH1 (FIG. 4), and checking positions of the through holes BH1 (FIG. 5) formed on the base wafer 11W. These positions can all be determined using a microscope. Upon achieving a desired alignment, the sealing material SL is heated to a temperature within an exemplary range of 350° C. to 400° C. while compressing the quartz-crystal wafer 10W and the base wafer 11W together. Thus, the quartz-crystal wafer 10W and base wafer 11W are bonded together.

In step S141, sealing material SL is applied uniformly on the surface M4 of each exterior frame 102 on the quartz-crystal wafer 10W. After achieving a preliminary hardening of the sealing material SL the quartz-crystal wafer 10W and lid wafer 12W can be stacked precisely.

Although the crystal wafer 10W and the lid wafer 12W are stacked, the sealing material SL does not yet flow into the communicating grooves 120. Consequently, the cavity CT is in communication with the exterior environment through the communicating grooves 120 and the through-holes DH1. This communication allows the multiple package cavities defined by the package base wafer, the quartz-crystal wafer, and the lid wafer to be filled either with an inert gas (not shown) or to be evacuated to a desired vacuum level. Filling the package cavities with an inert gas or evacuating them is performed by placing the stacked wafers in a chamber evacuated to the desired level or filled with a desired inert gas.

The sealing material SL is heated to a temperature in the exemplary range of 350° C. to 400° C. while compressing the quartz-crystal wafer 10W and the lid wafer 11W together. During this heating step, the sealing material SL may release unwanted gas. This gas is ventilated through the communicating grooves 120 on the lid wafer 12W and through the through-holes DH1. As the quartz-crystal wafer 10W and the lid wafer 12W are being compressed against each other while increasing the temperature of the sealing material, some of the sealing material SL melts and flows into the communicating grooves 120. Thus, the communicating grooves 120 are filled and sealed with the sealing material SL. After cooling the sealing material SL room temperature, the crystal wafer 10W and the lid wafer 12W are bonded together.

In step S142, outer connection electrodes 118a, 118b are formed.

In step S143, the 3-wafer sandwich comprising the crystal wafer 10W, base wafer 11W, and lid wafer 12W bonded together is separated into individual piezoelectric devices 100A. This separation desirably is performed by cutting along cut-lines CL, denoted by dot-dash lines in FIGS. 4, 5, and 6. Cutting can be performed using a dicing unit such as a laser beam or a dicing saw. Thus, several hundreds to several thousands of piezoelectric devices 100A are produced, each producing an accurate vibration frequency when electrically energized.

Second Embodiment of Piezoelectric Device

Figure 7:
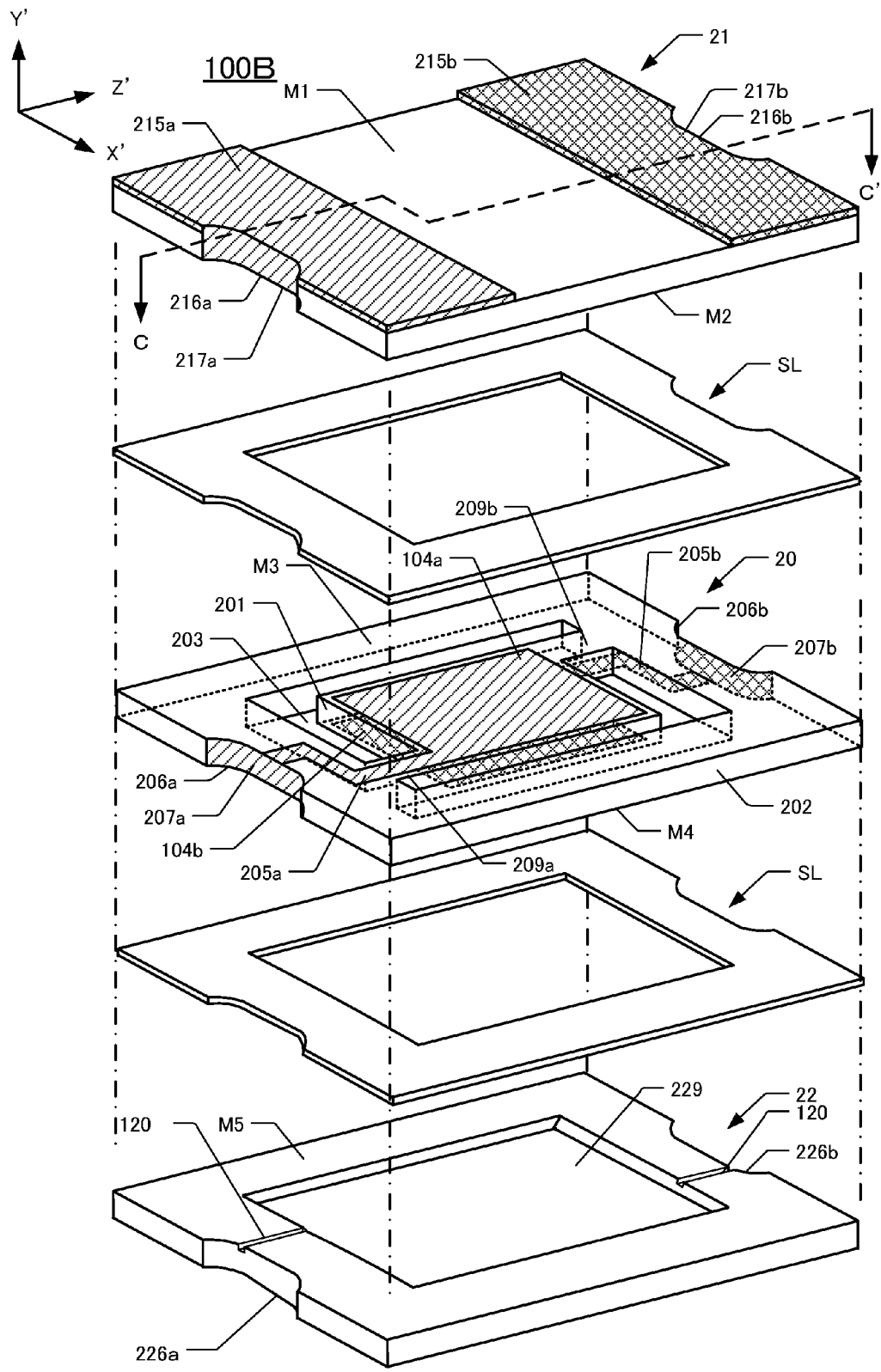
FIG. 7 is an exploded perspective view of a second embodiment of a piezoelectric device.
Figure 8:
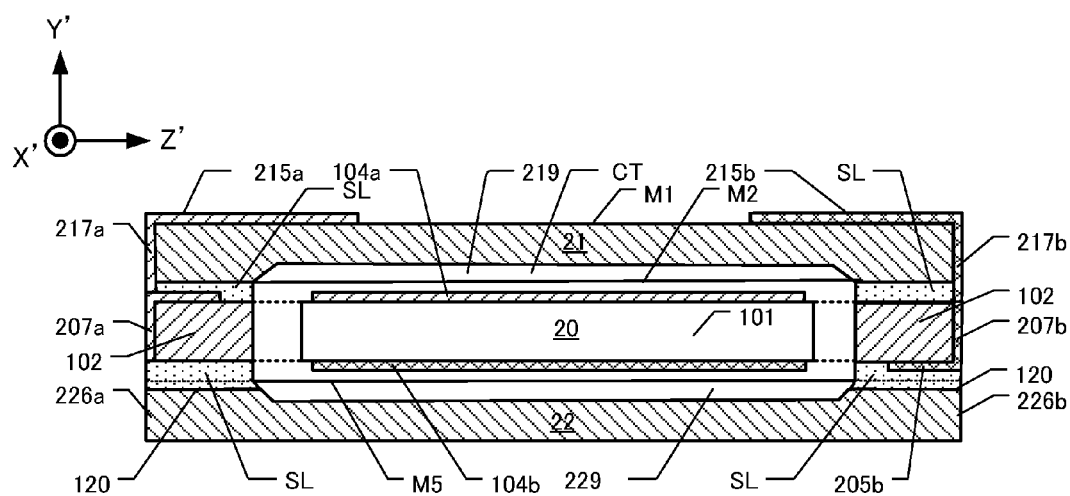
FIG. 8 is a cross-sectional view along the line C-C' line in FIG. 7, after the quartz-crystal frame, package base, and package lid 22 have been bonded together.

The second embodiment of a piezoelectric device 100B is shown in FIGS. 7 and 8. FIG. 7 is an exploded perspective view of the piezoelectric device 100B, wherein the view in FIG. 7 is upside-down, with the package base 21 being shown uppermost. FIG. 8 is an elevational section of a portion of FIG. 7 along the line C-C', after the crystal frame 20, package base 21, and package lid 22 have been bonded together. Connection electrodes (FIG. 2) are not shown in FIGS. 7 and 8.

In this embodiment 100B the castellations and communicating grooves 120 have different positions than corresponding features in the first embodiment 100A. Also, the quartz-crystal vibrating portion 201 of the crystal frame 20 as a different configuration than in the previous embodiment. The thickness of the quartz-crystal vibrating portion 201 and of the exterior frame 202 are the same as in the previous embodiment. Respective recesses are defined on the inner main surface of the package base 21 and of the package lid 22, thereby forming the package cavity CT. In this embodiment, components that are similar to corresponding components in the first embodiment have the same reference numerals.

This embodiment of a piezoelectric device 100B includes the quartz-crystal frame 20, a package base 21, and a package lid 22. The package base 21 and package lid 22 are fabricated of either glass or a quartz-crystal material. The quartz-crystal frame 20 and package base 21 are bonded together using a sealing material SL, and the quartz-crystal frame 20 and package lid 22 are bonded together using the sealing material SL. After bonding together these components, the package cavity CT (FIG. 8) is either evacuated or filled with an inert gas.

The frame 20 includes the bonding surfaces M3 and M4. The frame 20 includes an exterior frame portion 202 that surrounds the vibrating portion 201. On the main surfaces of the exterior frame 202, excitation electrodes 104a, 104b and electrically conductive extraction electrodes 205a, 205b are formed, respectively. Respective castellations 206a, 206b are formed on each side of the crystal frame 20, in the Z'-axis direction. Castellations 206a, 206b are connected to the extraction electrodes 205a, 205b, respectively. Similarly, edge-surface electrodes 207a, 207b (connected to the edge-surface electrodes 217a, 217b, respectively, on the package base 21) are formed. The castellations 206 are formed when the rectangular through-holes CH2 (FIG. 9) are cut during dicing.

The package base 21 includes an external main surface (mounting surface) M1 and an internal main surface (bonding surface) M2. A pair of external electrodes 215a, 215b are formed on the mounting surface M1. A respective castellation 216a, 216b is formed on each opposing edge (in the Z'-axis direction) of the package base 21. A respective edge-surface electrode 217a, 217b is formed on the inner surface of each castellation 216a, 216b, respectively, and connected to the respective external electrode 215a, 215b. A recess 219 (FIGS. 8 and 10) is defined in the internal main surface M2 of the package base 21. The castellations 216a, 216b are formed when corresponding rectangular through-holes BH2 (FIG. 10) are diced.

The package lid 22 includes an internal main surface (bonding surface) M5. A respective castellation 226a, 226b is formed on each opposing edge (in the Z'-axis direction) of the package lid 22. A recess 229 (FIGS. 8 and 11) is defined in the internal main surface M5 of the package lid 22. The main surface M5 also defines a respective communicating groove 120 extending between the recess 229 and the respective castellation 216a, 216b. The castellations 226a, 226b are formed when corresponding rectangular through-holes DH2 (FIG. 11) are diced.

Figure 9:
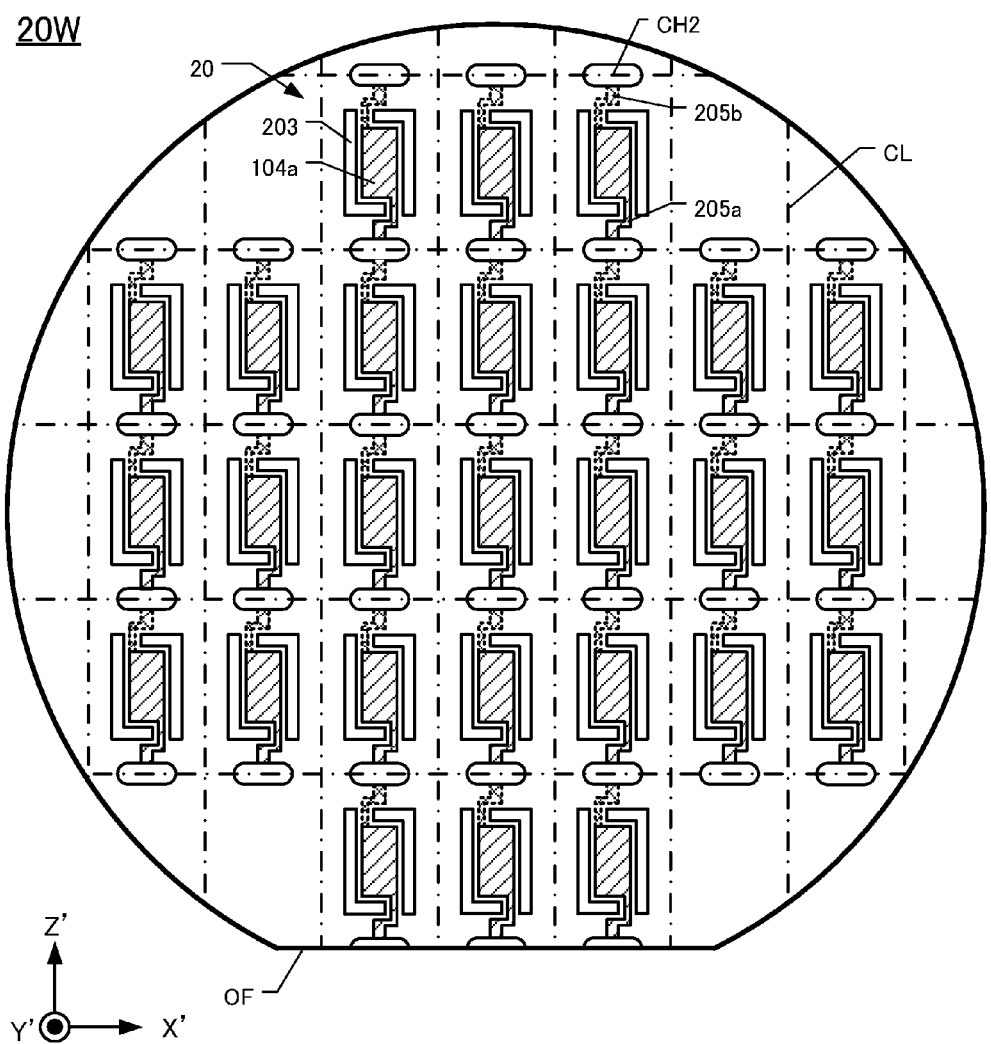
FIG. 9 is a plan view of a quartz-crystal wafer.
Figure 10:
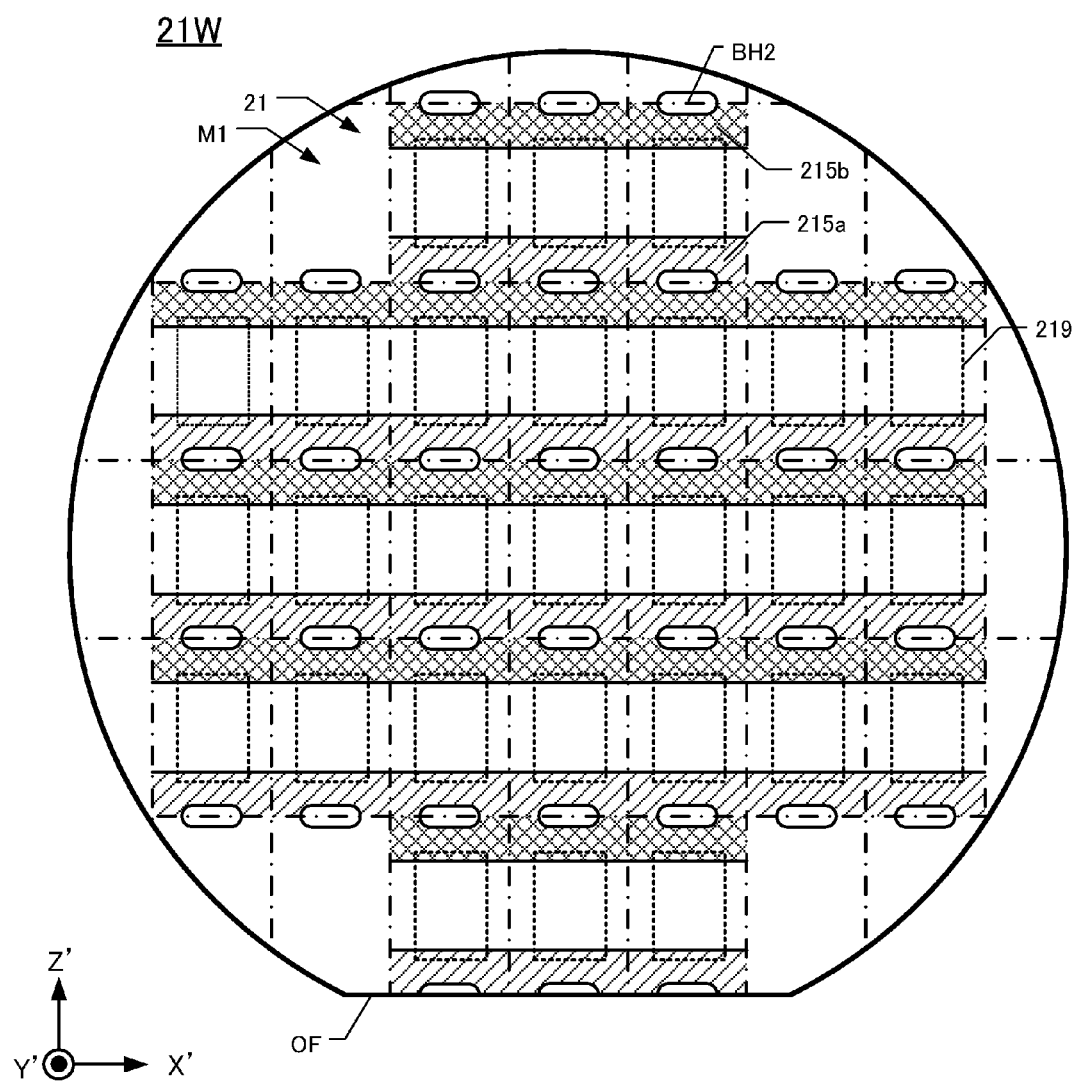
FIG. 10 is a plan view of a base wafer.
Figure 11:
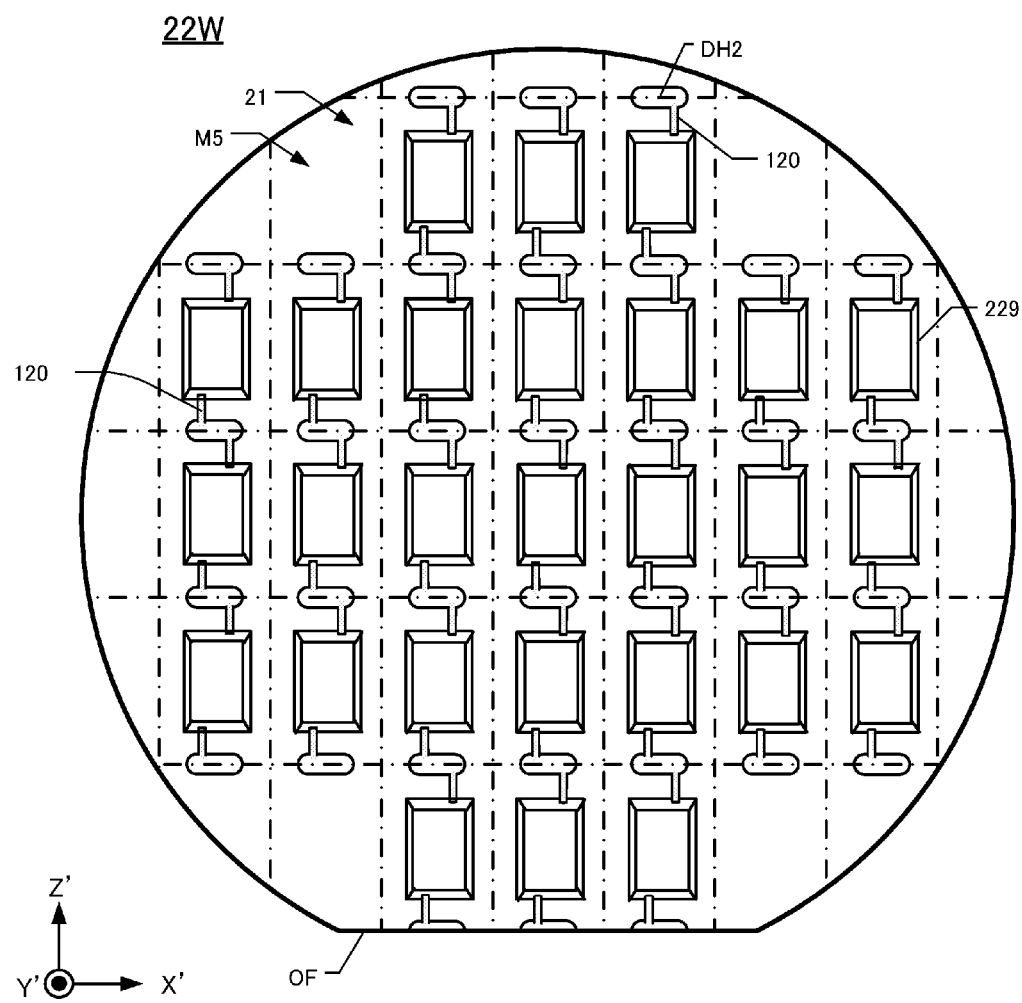
FIG. 11 is a plan view of a lid wafer.

The second embodiment of a piezoelectric device 100B shown in FIG. 7 is manufactured by method depicted by a flow-chart that is substantially similar to the flow-chart of FIG. 3. FIG. 9 is a plan view of the quartz-crystal wafer 20W, FIG. 10 is a plan view of the base wafer 21W, and FIG. 11 is a plan view of the lid wafer 22W.

The method for manufacturing this second embodiment 100B is described with reference to the flow-chart shown in FIG. 3. In the steps S101, S111, and S121, the rounded-rectangular through-holes CH2, BH2, and DH2, respectively, are formed. Also, the recess 219 is formed on the bonding surface of the package base 21, and the recess 229 is formed on the bonding surface of the package lid 22.

Further with respect to step S101, as indicated in FIG. 9, the profile outlines of the multiple quartz-crystal frames 20 are defined by etching. A respective rounded-rectangular through-hole CH2 is formed on each edge (Z'-axis direction) of each quartz-crystal frame 20. Later, a dicing unit cuts through the quartz-crystal wafer 20W and thus cuts the through-holes precisely in half. Each half forms a respective castellation 206a, 206b (FIG. 7).

In step S111 (see FIG. 10), a respective rounded-rectangular through-hole BH2 is formed on each edge (Z'-axis direction) of each package base 21. Later, a dicing unit cuts through the base wafer 21W and thus cuts the through-holes DH2 precisely in half. Each half forms a respective castellation 216a, 216b (FIG. 7). Also, a recess 219 is defined in the bonding surface of the package base 21.

In step S121 (see FIG. 11), a respective rounded-rectangle through-hole DH2 is formed on each edge (Z'-axis direction) of each package lid 22. Later, a dicing unit cuts through the lid wafer 22W while cutting the through-holes DH2 precisely in half. Each half forms a respective castellation 226a, 226b (FIG. 7). Also, a recess 229 is defined in the bonding surface of the package lid 22. Communicating grooves 120 are defined in the bonding surface, extending between the recess 229 and the respective castellation 226a, 226b.

In both the first and second embodiments, although communicating grooves 120 are formed on the bonding surfaces of the respective package lids 12, 22, the communicating grooves alternatively can be formed on the bonding surface M4 of the quartz-crystal wafer. Also, in the flow-chart shown in FIG. 3, although the lid wafer and quartz-crystal wafer are bonded together after bonding together the base wafer and quartz-crystal wafer, the lid wafer and quartz-crystal wafer alternatively can be bonded together after bonding together the base wafer and quartz-crystal wafer. In this manufacturing step, the communicating grooves 120 can be formed on the bonding surface M2 of the package base 11, 21, or on the bonding surface M3 of the quartz-crystal wafer.

Further alternatively from the flow-chart of FIG. 3, the base wafer, quartz-crystal wafer, and lid wafer can be bonded together simultaneously. In such a method, the communicating grooves are formed in at least the bonding surface M2 of the package base 11, 21, the bonding surface M5 of the package lid 12, 22, or the bonding surface M3 of the quartz-crystal wafer.

Third Embodiment of Piezoelectric Device

Figure 12A:
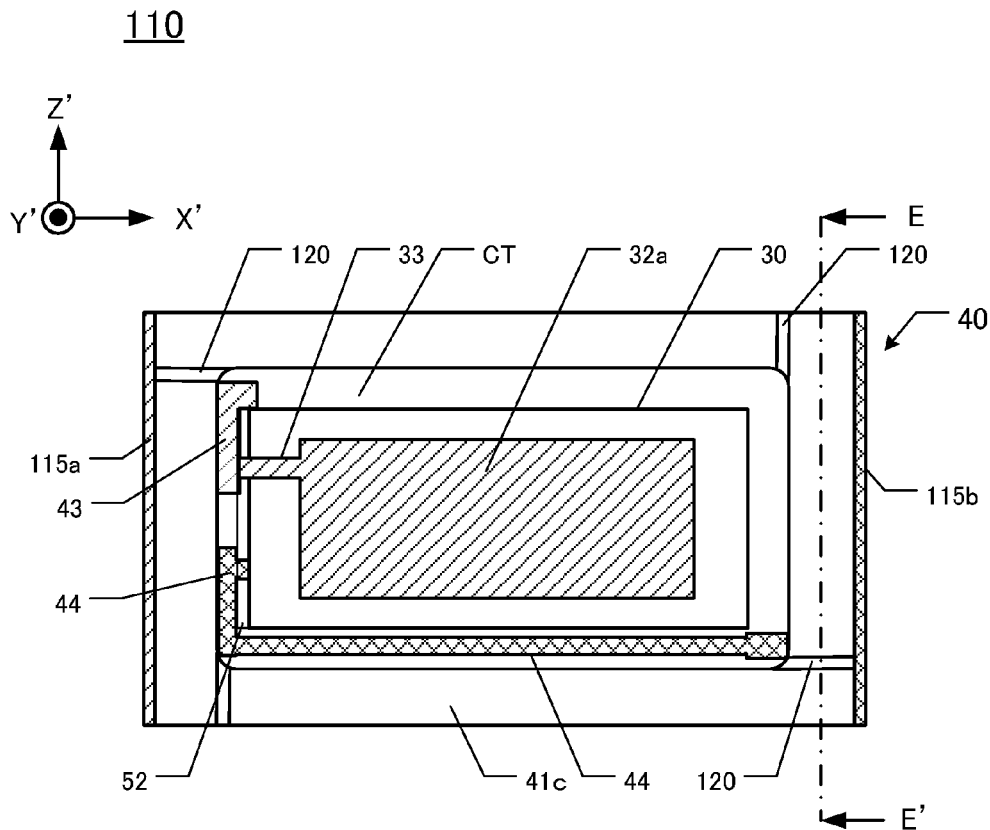
FIG. 12A is a plan view of a ceramic package of a third embodiment of a piezoelectric vibrating device after removing the package lid.
Figure 12B:
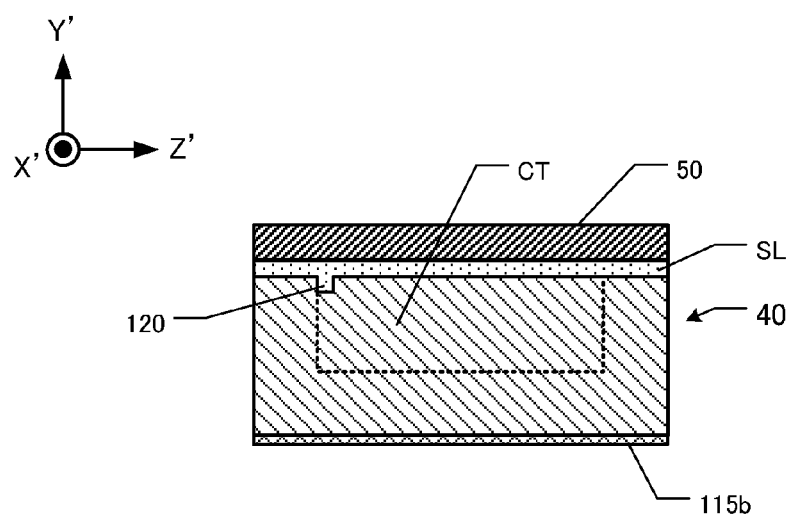
FIG. 12B is a cross-sectional view of the third embodiment of a piezoelectric device 110, along the line E-E' in FIG. 12A.

A piezoelectric device 110 according to this embodiment is shown in FIG. 12A and a plan view with the package lid 50 removed. FIG. 12B is an elevational section along the line E-E' in FIG. 12A. The piezoelectric device 110 is a surface-mount type and comprises an insulative ceramic package 40 covered by a package lid 50. The package lid 50 is fabricated of a kovar alloy or of glass.

The ceramic package 40 includes a bottom-surface ceramic layer 41a, a wall ceramic layer 41b, and a mount ceramic layer 42, all made of an alumina-based ceramic powder and green sheets including a binder. The ceramic package 40 comprises multiple ceramic layers 41a, 41b. The package 40 defines a package cavity CT in which the AT-cut quartz-crystal vibrating piece 30 is mounted. Respective communicating grooves 120 extend on the upper main surface 41c of the ceramic wall 41b, and communicate with the cavity CT. The ceramic package 40 is formed by stacking multiple, co-aligned ceramic layers, followed by exposing the stacked ceramic layers to a sintering condition. The ceramic package 40 includes surface-mountable external electrodes 115a, 115b located on the lower main surface BT.

The AT-cut quartz-crystal vibrating portion 30 includes, on its first and second main surfaces, respective excitation electrodes 32a, 32b. The vibrating portion 30 also includes respective connection electrodes 33, on the first and second main surfaces, that are connected to respective excitation electrodes 32a, 32b. The connection electrodes 33 are electrically connected to respective connection electrodes 43, 44, and the AT-cut quartz-crystal vibrating piece 30 is bonded to a mount 42 (formed in the cavity CT) using electrically conductive adhesive 31.

Figure 13:
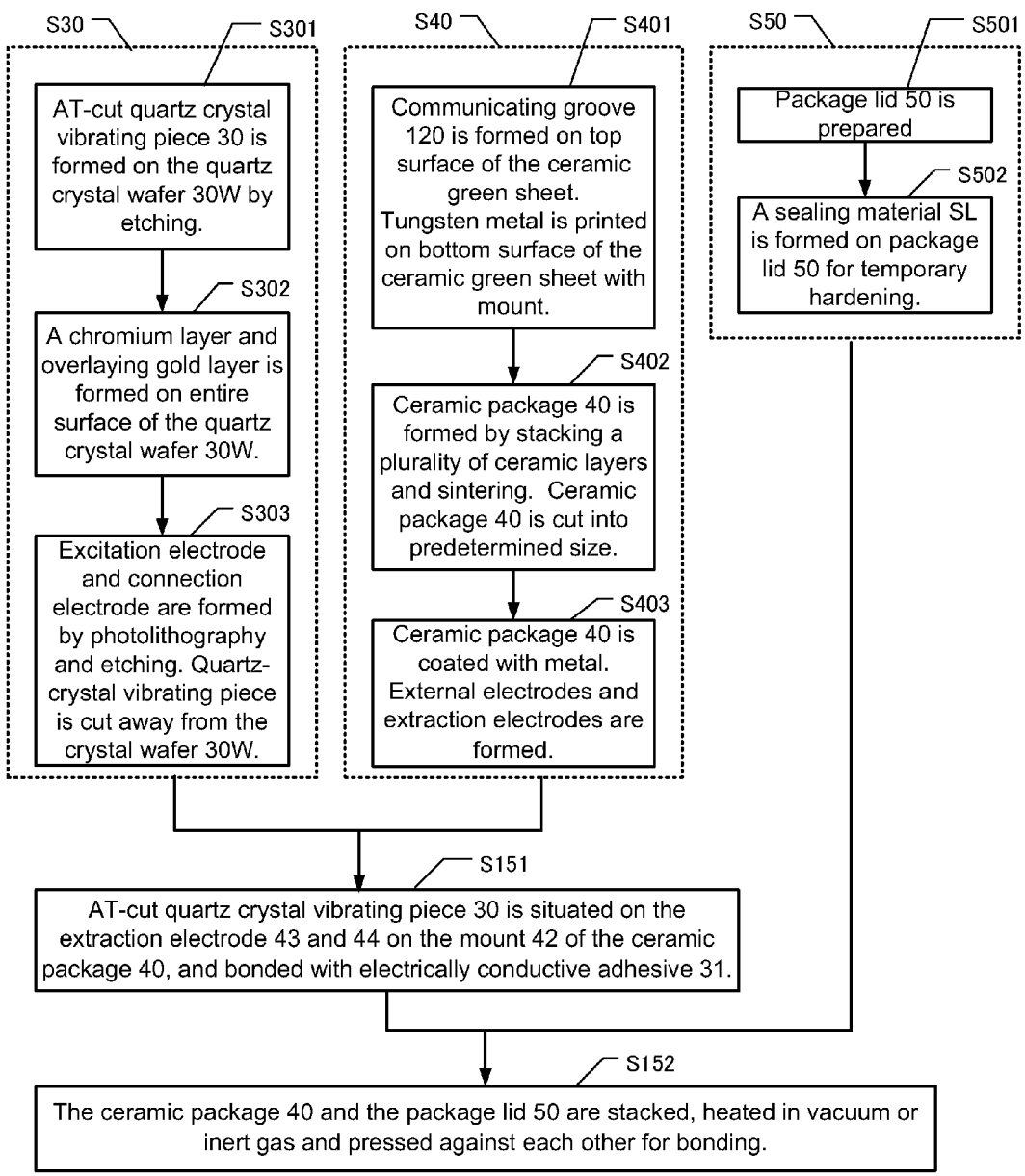
FIG. 13 is a flow-chart of an embodiment of a method for manufacturing the third embodiment of a piezoelectric vibrating device.

This third embodiment 110 can be manufactured by an embodiment of a manufacturing method as shown in the flow-chart of FIG. 13. In protocol S13, the AT-cut quartz-crystal vibrating piece 30 is manufactured. Protocols S40 (manufacturing the ceramic package 40) and S50 (manufacturing the package lid 50) can be performed separately or in parallel.

In protocol S30, an AT-cut quartz-crystal vibrating piece 30 is manufactured. Protocol S30 includes steps S301 to S303. In step S301 multiple AT-cut quartz-crystal vibrating pieces 30 are formed on a quartz-crystal wafer 30W (not shown) by lithography and etching. In step S302 a layer of chromium (Cr) and an overlying layer of gold (Au) are formed on the entire main surface of a quartz-crystal wafer 30W by sputtering or vacuum-deposition. The thickness of chromium foundation layer is in an exemplary range of 0.05 µm to 0.1 µm, and the thickness of gold layer is in an exemplary range of 0.2 µm to 2 µm.

In step S303, a photoresist is applied uniformly on the surface of the metal film. Using an exposure tool (not shown), the outline pattern of the excitation electrodes 32a, 32b, and of the connection electrodes 33 is exposed on the quartz-crystal wafer 30W. Afterword, portions of the metal layer not protected by the photoresist are etched. As shown in FIGS. 1, 2A, and 2B, the excitation electrodes 32a, 2b and the connection electrodes 33 are formed on the quartz-crystal wafer 30W. The AT-cut quartz-crystal vibrating piece 30 is cut away from the quartz-crystal wafer 30W.

In protocol S40, the ceramic package 40 is manufactured according to steps S401 to S403. In step S401 layers are made of ceramic green sheets, including a bottom-surface ceramic layer 41a, a wall-surface ceramic layer 41b, and a mount ceramic layer 42 (see FIG. 12). On the top surface 41c of the wall ceramic layer 41b, communicating grooves 120 are formed that communicate with the cavity CT. On the ceramic layer 41a including the mount 42, tungsten metal is printed on the ceramic green sheet thereof, destined for use as external electrodes 115, 115b and extraction electrodes 43, 44. In step S402, a ceramic package 40 is formed by stacking multiple green ceramic layers and sintering them at a temperature over 1,300° C. After sintering, the ceramic package 40 is cut to predetermined sizes. In step S403, on the ceramic package 40, a film of nickel is formed over a tungsten layer, and a film of gold is applied atop the tungsten layer. The extraction electrodes 43, 44 are formed on the lower main surface BT of the ceramic package 40 and the mount 42. The external electrodes 115a, 115b are formed outside the ceramic package 40. Extraction electrodes 43, 44 are connected to the respective external electrodes 115a, 115b.

In protocol S50, the package lid 50 is manufactured. Protocol S50 includes steps S501 to S502. In step S501, a package lid 50 made of glass or kovar alloy is formed. In step S502, a sealing material SL is prepared and uniformly applied so as to extend peripherally around the package lid 50. For example, if the sealing material SL is low-melting-point (LMP) glass, the LMP glass is applied peripherally around the package lid 50 by screen-printing, for example, and preliminarily cured. If the sealing material SL is polyimide resin, the resin is applied peripherally around the package lid 50 and preliminarily cured.

In step S151 the AT-cut quartz-crystal vibrating pieces 30 are disposed on respective extraction electrodes 43 on the mount 42 of the ceramic package 40, and bonded thereto using electrically conductive adhesive 31. In step S152 the package lid 50 is placed inside the ceramic package 40 in the package chamber CT. Before completion of packaging, the package chamber CT will be either evacuated or filled with an inert gas. The ceramic package 40 and package lid 50 are heated in a vacuum or in an inert gas environment at a temperature in the exemplary range of 350° C. to 400° C. while simultaneously compressing the lid and ceramic package together.

Whenever the ceramic package 40 and package lid 50 are stacked precisely relative to each other, the sealing material SL does not flow into the communicating grooves 120, which can allow the cavity CT to communicate with the outside environment. This property is exploited during bonding by placing a wafers in a chamber filled with inert gas (not shown) or evacuated to a desired vacuum level (not shown). In the chamber the sealing material SL is heated to a temperature in the exemplary range of 350° C. to 400° C. while compressing the ceramic package 40 and package lid 50 together. During heating, unwanted gas released from the sealing material SL does not remain in the cavity CT; rather, the gas is ventilated through the communicating grooves 40 in the ceramic package 40. As the ceramic package 40 and package lid 50 are being compressed against each other while the temperature of the sealing material SL is rising, molten sealing material SL flows into the communicating grooves 120. Thus, the communicating grooves 120 are sealed by the sealing material SL in this method. After cooling the sealing material SL to room temperature, the ceramic package 40 and the package lid 50 are bonded firmly together.

Representative embodiments have been described in detail above. As evident to those skilled in the art, the present invention may be changed or modified in various ways within the technical scope of the invention. For example, as an alternative to AT vibrating pieces, the present invention may be directed to the manufacture of tuning-fork type vibrating pieces. In this specification, although the various embodiments have been described in the context of AT-cut quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

What is claimed is:

1. A piezoelectric device, comprising:
   a piezoelectric frame including a piezoelectric vibrating piece having first and second main surfaces and a respective excitation electrode on each of the first and second main surfaces, and including an outer frame surrounding the piezoelectric vibrating piece;
   a package base having an inner and an outer main surface, the outer main surface including at least one external electrode, and the inner main surface being bonded to the second main surface of the piezoelectric frame;
   a package lid having an inner and an outer main surface, the inner main surface being bonded to the first main surface of the piezoelectric frame;
   a sealing material disposed peripherally relative to the outer frame so as to be peripherally arranged relative to each of the first and second main surfaces of the piezoelectric frame, the sealing material thus bonding the piezoelectric frame to the package lid and to the package base to form a package defining a package cavity containing the piezoelectric vibrating piece; and
   at least one communicating groove extending from the cavity and defined in at least one of the first and second main surfaces of the outer frame, the inner main surface of the package base, and the inner main surface of the package lid, the at least one communicating groove being sealed with the sealing material.

2. The piezoelectric device of claim 1, wherein:
   the package has a rectangular profile when viewed from above the package lid or below the package base;
   the rectangular profile includes four corners;
   each corner includes a respective castellation defining a corresponding edge-surface;
   a first edge-surface includes a respective first edge-surface electrode extending at least between the first and second main surfaces of the piezoelectric frame and being connected to one of the excitation electrodes; and
   a second edge-surface includes a respective second edge-surface electrode extending at least between the inner and the outer main surfaces of the package base and being connected to another of the external electrodes.

3. The piezoelectric device of claim 2, wherein the sealing material is an adhesive made of glass, epoxy resin, or polyimide resin.

4. The piezoelectric device of claim 1, wherein:
   the package has a rectangular profile when viewed from above the package lid or below the package base;
   the rectangular profile includes four sides;
   at least two sides include respective castellations each defining a corresponding edge-surface;
   a first edge-surface includes a respective edge-surface electrode extending at least between the first and second main surfaces of the piezoelectric frame and being connected to one of the excitation electrodes; and
   a second edge-surface includes a respective edge-surface electrode extending at least between the inner and the outer main surfaces of the package base and being connected to another of the external electrodes.

5. The piezoelectric device of claim 4, wherein the sealing material is an adhesive made of glass, epoxy resin, or polyimide resin.

6. The piezoelectric device of claim 1, wherein the sealing material is an adhesive made of glass, epoxy resin, or polyimide resin.

7. A piezoelectric device, comprising:
   a package base comprising an inner main surface and an outer main surface, the inner main surface defining a cavity, and the outer main surface including at least one external electrode;
   a piezoelectric vibrating piece disposed in the cavity, the piezoelectric vibrating piece having a first main surface including a first excitation electrode and a second main surface including a second excitation electrode;
   a package lid having an inner main surface and an outer main surface, the inner main surface of the package lid being bonded to the package base by a sealing material, thereby forming a package containing the piezoelectric vibrating piece; and
   at least one communicating groove defined in the inner main surface of the package base or the inner main surface of the package lid, the communicating groove extending from the cavity to outside the package, the communicating groove being sealed with the sealing material.

8. The piezoelectric device of claim 7, wherein the sealing material is an adhesive made of glass, epoxy resin, or polyimide resin.

* * * * *